(12) United States Patent
Ferguson

(10) Patent No.: US 7,406,493 B2
(45) Date of Patent: Jul. 29, 2008

(54) UP-SAMPLING HALF-BAND RECONSTRUCTION FILTERING

(75) Inventor: Kevin M. Ferguson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 672 days.

(21) Appl. No.: 10/802,305

(22) Filed: Mar. 17, 2004

(65) Prior Publication Data

US 2005/0210091 A1 Sep. 22, 2005

(51) Int. Cl.
*G06F 17/10* (2006.01)
(52) U.S. Cl. ...................................... 708/320
(58) Field of Classification Search ................ 708/320
See application file for complete search history.

(56) References Cited

U.S. PATENT DOCUMENTS

| | | | | | |
|---|---|---|---|---|---|
| 3,370,292 | A | * | 2/1968 | Deerfield | 708/320 |
| 4,791,390 | A | * | 12/1988 | Harris et al. | 708/320 |
| 5,014,232 | A | * | 5/1991 | Andre | 708/320 |
| 5,557,560 | A | * | 9/1996 | Dix et al. | 708/3 |

* cited by examiner

*Primary Examiner*—Tan V. Mai
(74) *Attorney, Agent, or Firm*—Francis I. Gray; Matthew D. Rabdau

(57) ABSTRACT

An up-sampled half band reconstruction filter has a seagull architecture in the form of a pair of parallel infinite impulse response (IIR) filters, one receiving as an input an input signal delayed by one sample time and the other receiving as an input a reverse version of the input signal delayed by one sample time. The outputs from the pair of parallel IIR filters are combined with the input signal to produce a reconstruction filter output in response to the input signal.

4 Claims, 8 Drawing Sheets

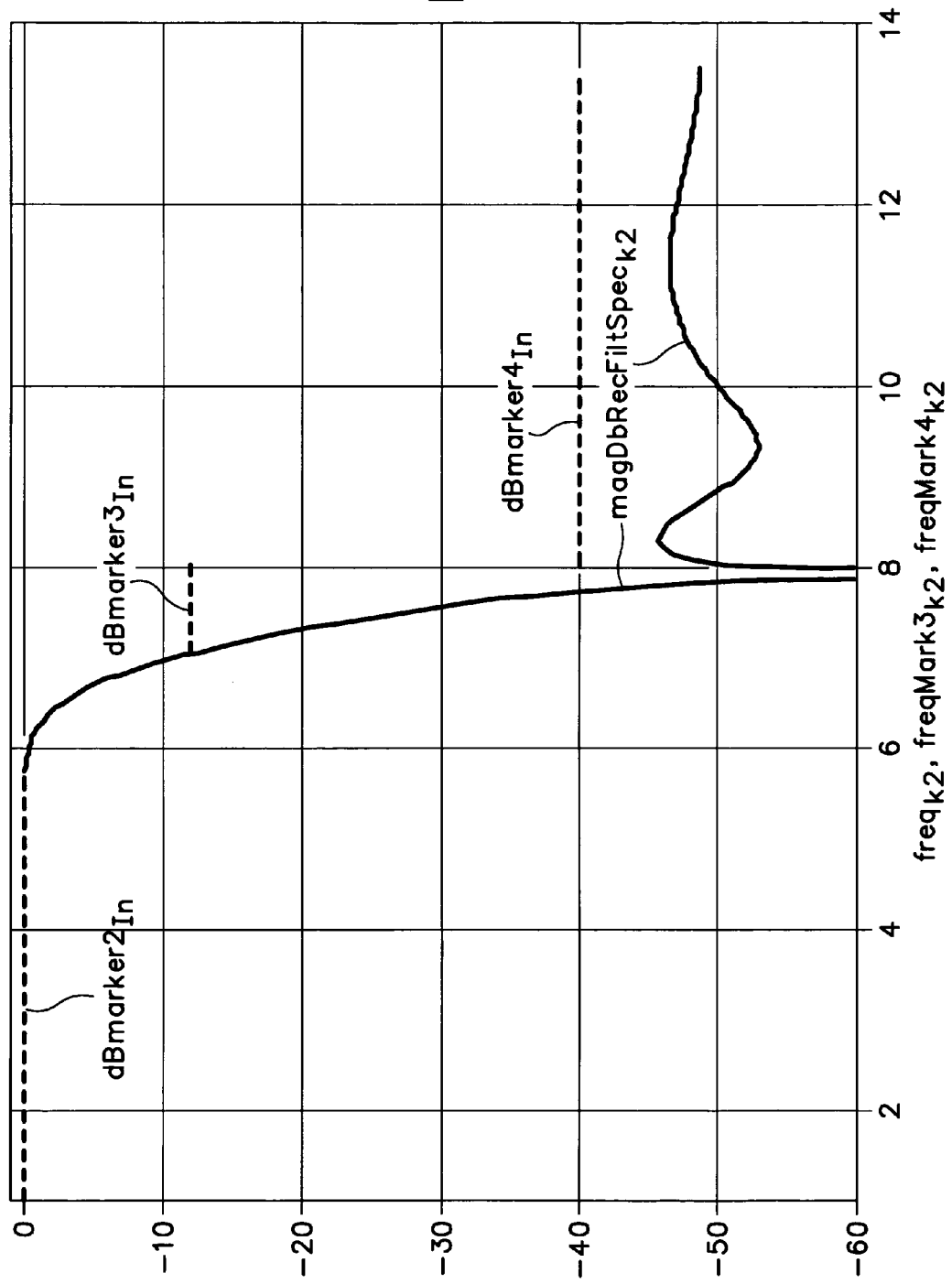

UP-SAMPLING HALF-BAND RECONSTRUCTION FILTERING

BACKGROUND OF THE INVENTION

The present invention relates to signal filtering, and more particularly to a method of up-sampling half-band reconstruction filtering that has greater computational efficiency in order to have realtime performance in a video waveform monitor.

Reconstruction filters amount to specialized lowpass filters with sin(x)/x impulse responses, and are used for many applications, from digital to analog conversion to interpolation for waveform displays. The most common method of reconstruction is through the used of two-times up-sampling with half-band finite impulse response (FIR) filtering—typically a time windowed sin(x)/x impulse response with the following for improved efficiency:

1) Zero values (even samples of sin(x)/x) ignored;
2) "Folded" architecture, adding input data values before multiplying by common coefficients (taking advantage of symmetry of the impulse response).

An example implementation of this method is for digital to analog conversion reconstruction filtering for standard definition video using the Recommendation ITU-R BT.601-5 filter specifications (Appendix 2 to Part A, FIG. 3: Specifications for a luminance or RGB signal filter used when sampling at 13.5 MHz). A typical implementation, as shown in FIG. 1, uses sixteen multiplications and thirty-two additions.

BRIEF SUMMARY OF THE INVENTION

Accordingly the present invention provides a method of up-sampling half-band reconstruction filtering that is computationally more efficient than previously. An up-sampled half-band reconstruction filter has a seagull architecture in the form of a pair of parallel IIR filters, one receiving as an input an input signal, such as a video line of data, delayed by one sample time and the other receiving as an input a reverse version of the input signal delayed by one sample time. The outputs from the pair of parallel IIR filters are combined with the input signal to produce a reconstruction filter output in response to the input signal.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIGS. 5a and 5b are graphic views showing plots of frequency response of the filter of FIG. 2 with templates as specified by a specific video standard.

DETAILED DESCRIPTION OF THE INVENTION

Figure 1:
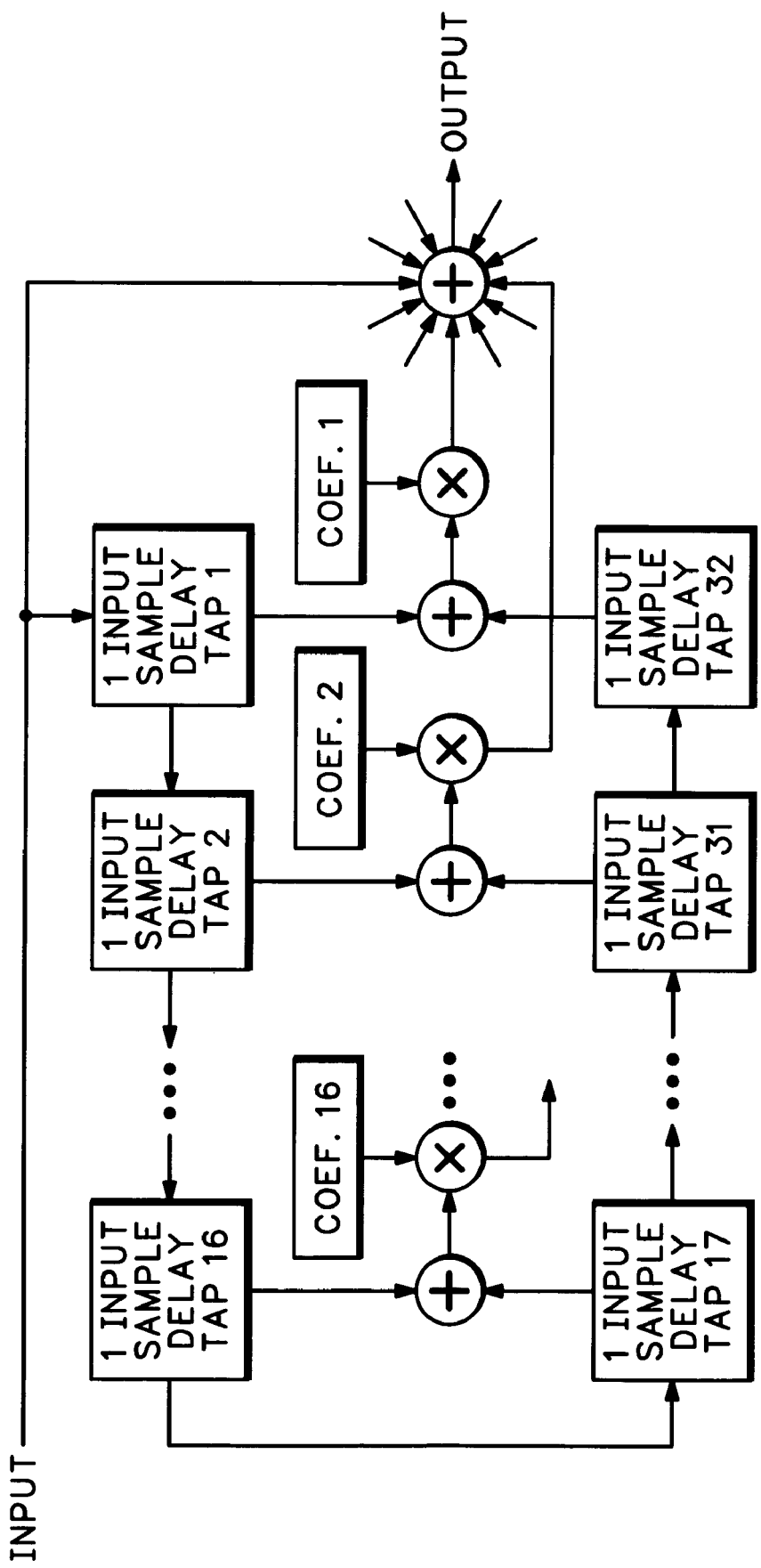
FIG. 1 is a block diagram view of a reconstruction filter according to the prior art.
Figure 2:
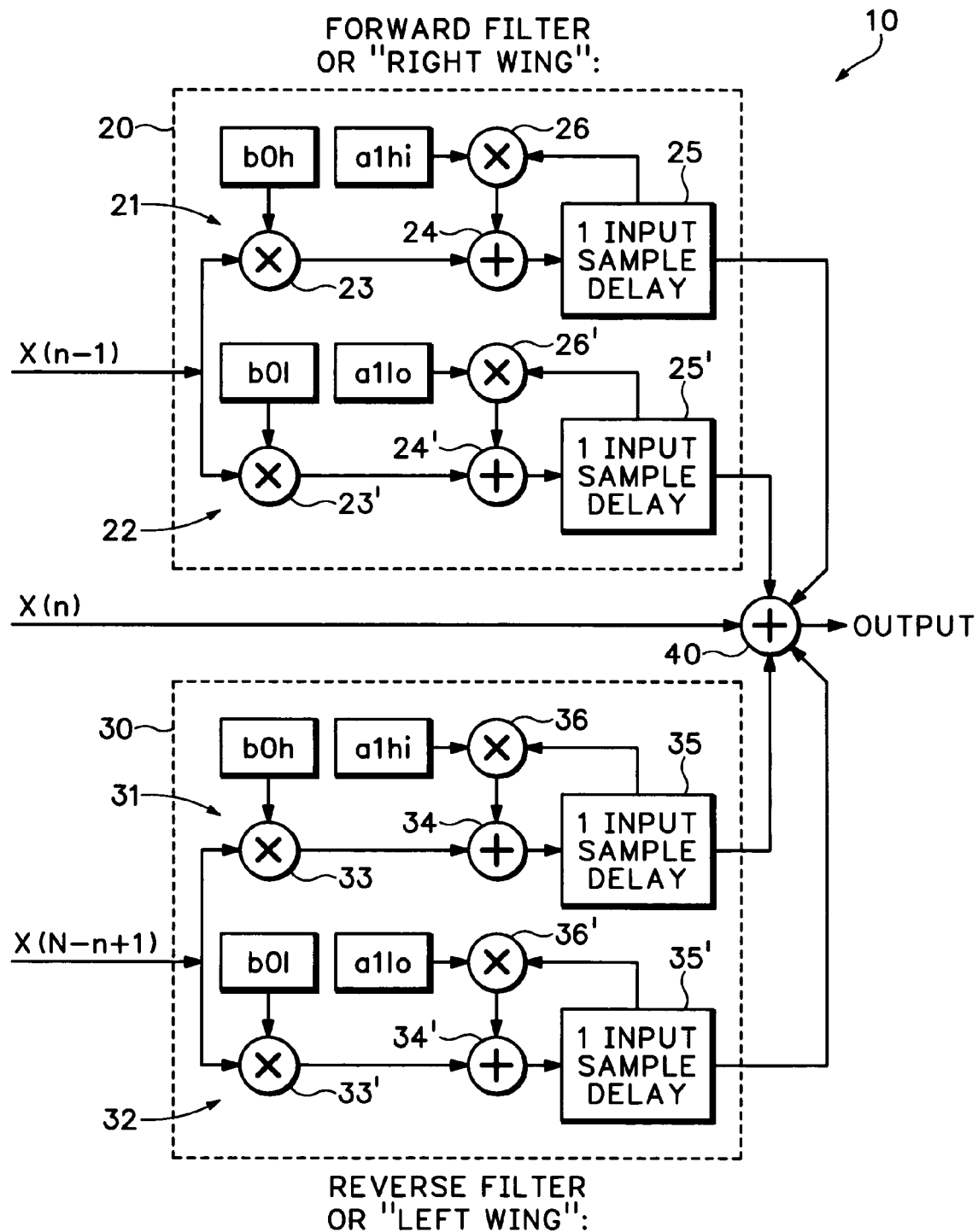
FIG. 2 is a block diagram view of a reconstruction filter according to the present invention.

Referring now to FIG. 2 a non-causal half-band reconstruction filter 10 is shown using a "/|\" or "seagull" architecture. The seagull architecture includes a set of simple parallel filters—for the present example a pair of first-order infinite impulse response (IIR) filters 20, 30 (one forward and one reverse) is shown—along with an "all pass" filter (which is simply the original data, X(n)). A delayed input, X(n−1), to the forward IIR filter 20 represents the original data input, X(n), with a delay of one input sample time, and a reverse input, X(N−n+1), to the reverse IIR filter 30 represents a reversed input record with a delay of one input sample time. The outputs from the IIR filters 20, 30 are input to an output summer 40 together with the input signal to produce the reconstruction filter output. The output summer 40 is an aggregate of four adders, like the output summer in FIG. 1 is an aggregate of sixteen adders.

The signal input to each IIR filter 20, 30 travels two separate paths—a "high" frequency path 21, 31 and a "low" frequency path 22, 32. Each path includes a multiplier 23, 23'; 33, 33', adder 24, 24'; 34, 34' and delay 25, 25'; 35, 35' in series, the delay being one input sample delay. The outputs from the delays 25, 25'; 35, 35' are input to the output summer 40 as well as to respective second multipliers 26, 26'; 36, 36', the outputs of which are input to the respective adders 24, 24'; 34, 34'. The input multipliers 23, 23'; 33, 33' have one of two coefficients, $b_{0hi}$, $b_{0lo}$, as the multiplicand depending upon the signal path, and the second multipliers 26, 26'; 36, 36' have one of two different coefficients, $a_{1hi}$, $a_{1lo}$, as the multiplicand.

As shown each IIR filter 20, 30 is used to approximate only one side of the main lobe of the sin(x)/x. Thus the IIR filters 20, 30 are identical except for the direction in which they process. This takes advantage of the fact that for a half-band filter, the frequency of the sin(x) function is at $\pi$ in the z-plane (Nyquist). In order to approximate sin(x)/x only the 1/x factor need be approximated. This corresponds to controlling the damping factor in a filter with a pole at Nyquist frequency. Therefore the design of the reconstruction filter of the present invention is reduced to approximating 1/x as a sum of decaying exponentials (damped sin(x) responses). The specific design used to approximate 1/x as a sum of decaying exponentials depends on the filter design specifications which in turn determine the areas of performance to be optimized. For the Recommendation ITU-R BT.601-5 filter mentioned above, two IIR filters 20, 30 are used, one which primarily contributes to short time 1/x approximation and the other to longer term 1/x approximation.

The design methodology used is simple relative to other IIR filter design methods since only the 1/x envelope of the sin(x)/x response is approximated using only the damping factors (controlled by moving each z-plane pole radius between zero and one) and relative filer weightings need be determined (since all poles are at an angle of $\pi$-Nyquist frequency). For the ITU-R BT.601-5 filter example only two unique poles need to be selected, corresponding to the $a_{1hi}$ and $a_{1lo}$ values, and the corresponding gain of each, reflected in the $b_{0hi}$ and $b_{0lo}$ values. For other design specifications having more or less poles, corresponding more or less parallel IIR filters are used.

An illustration for designing "seagull" filters includes determining approximately how may poles will suffice and the initial coefficient values. The 1/x response is approximated by a sum of decaying exponentials:

$$\text{synResponse}_x = b_{01} * e^{-d1*x} + b_{02} * e^{-d2*x}$$

To simulate a reference response of $1/(1+x)$ the respective coefficients become:

$$d1=0.05\ d2=0.6\ b_{01}=0.15\ b_{02}=1-b_{01},$$

d1 and d2 being the damping factors and $b_{01}$ and $b_{02}$ being the respective weights. The values of the reference response and the synthesized response are approximately the same.

The first IIR filter may be approximated by:

$$iir1_x=\text{if}(x>0, iir1_{x-1}*a_{11}, b_{01})$$

where $a_{11}=1/(1+d1)=0.952$. The response curve of $iir1_x$ is approximately the same as $b_{01}*e^{-d1*x}$.

Likewise the second IIR filter may be approximated by:

$$iir2_x=\text{if}(x>0, iir2_{n-1}*a_{12}, b_{02})$$

where $a_{12}=1/(1+d2)=0.625$. Again the response curve of $iir2_x$ is approximately the same as $b_{02}*e^{-d2*x}$. The sum of $iir1_x$ and $iir2_x$ therefore approximates the reference response of $1/(1+x)$.

Figure 3A:
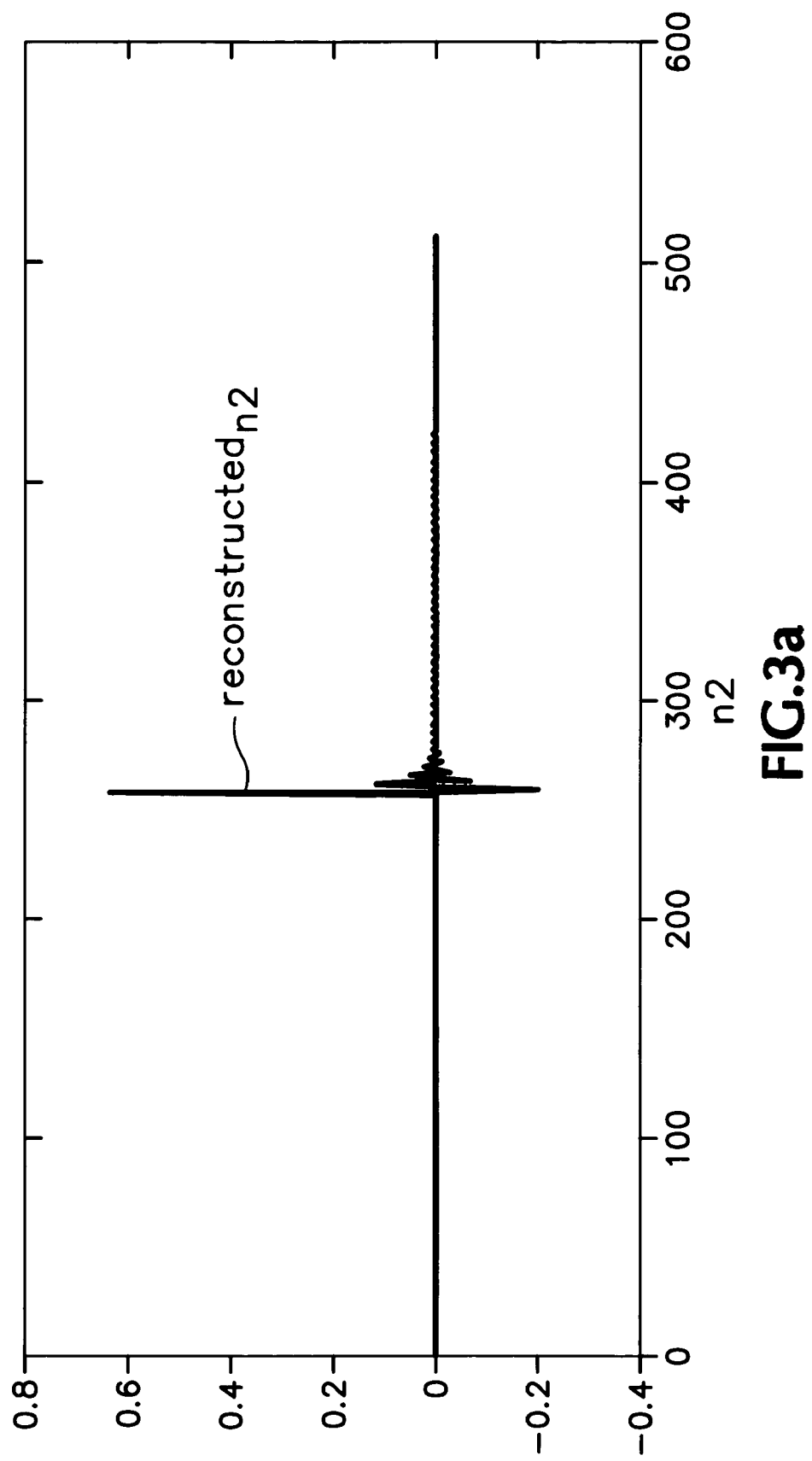
FIGS. 3a, 3b and 3c are graphic views showing the impulse responses of portions of the filter shown in FIG. 2 according to the present invention.
Figure 3B:
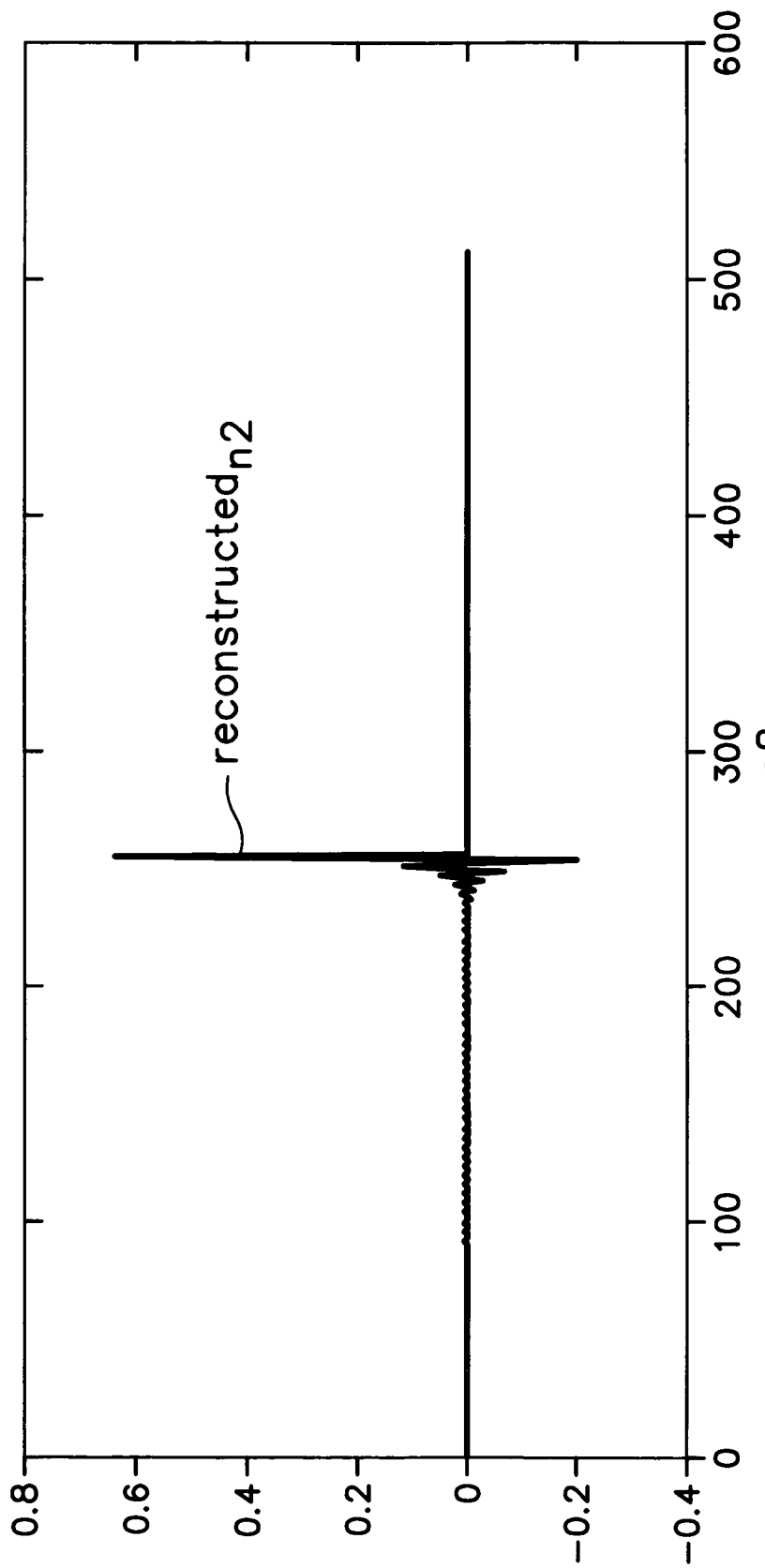
Figure 3C:
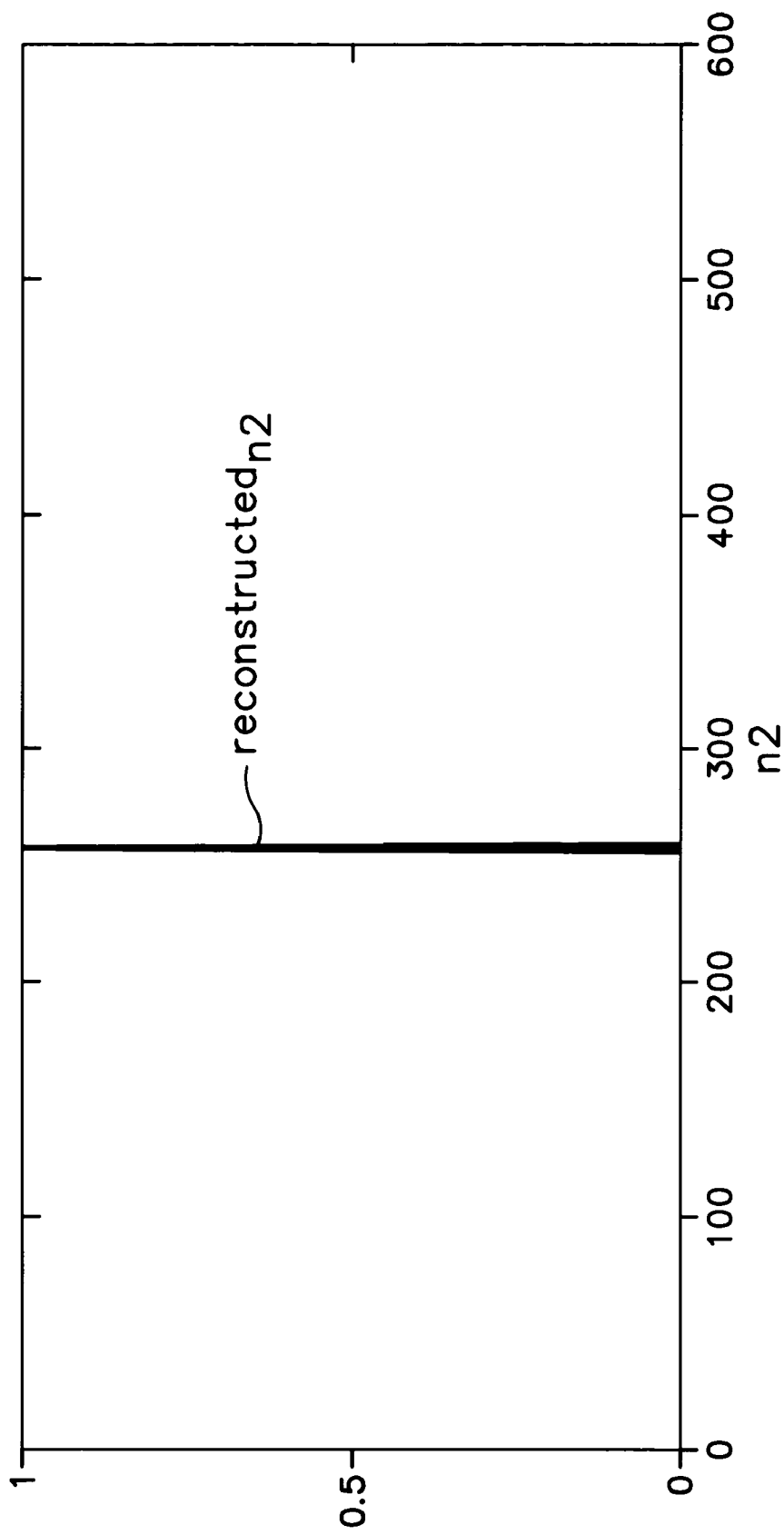
Figure 4:
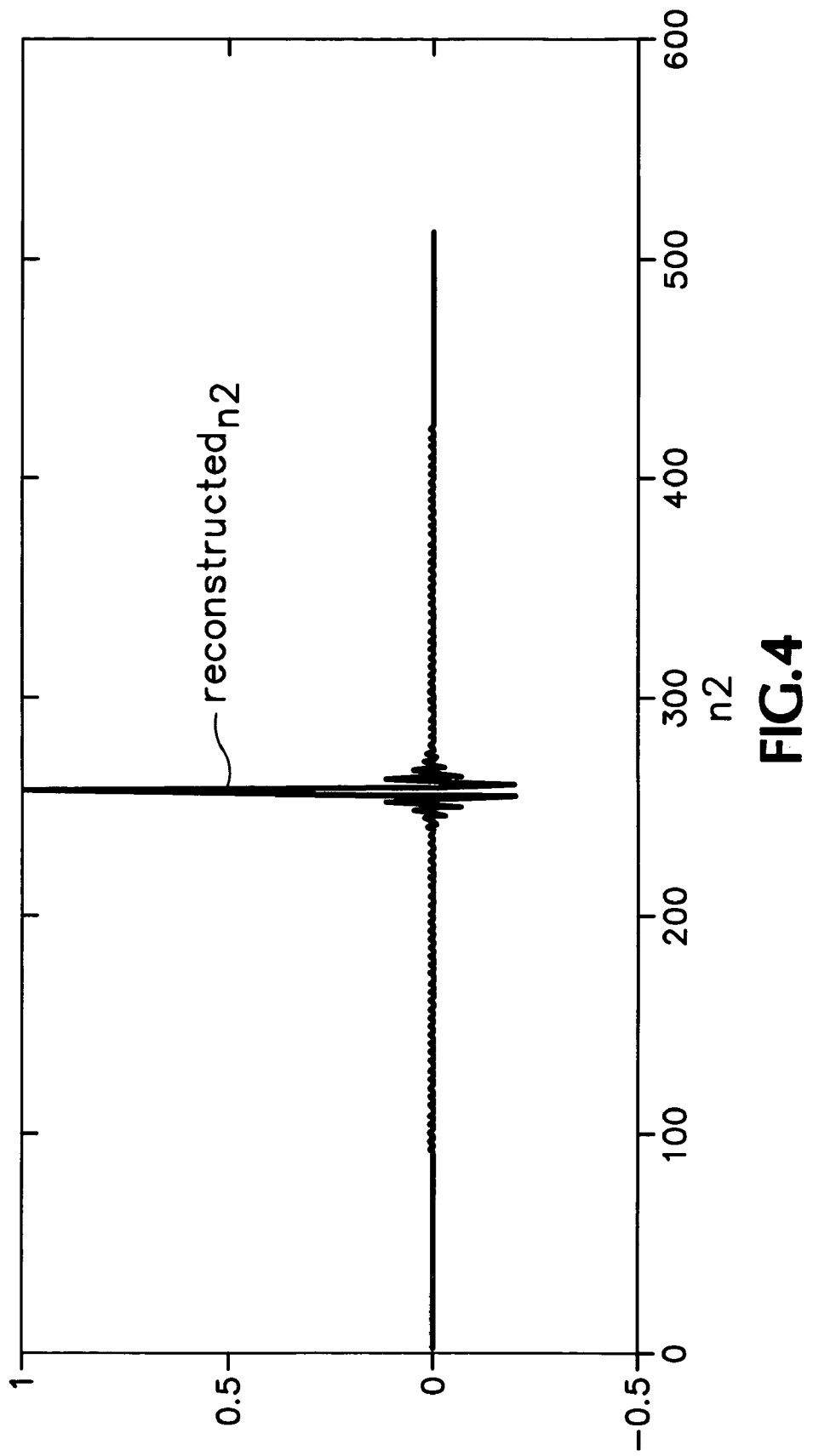
FIG. 4 is a graphic view showing a final impulse response for the filter shown in FIG. 2 according to the present invention.

FIG. 3a shows a plot of the impulse response of the forward filter 20, while FIG. 3b shows a plot of the impulse response of the reverse filter 30. FIG. 3c for comparison is a plot an original input impulse that forms the center of the $\sin(x)/x$ response. FIG. 4 shows the impulse response of the reconstruction filter 10 as a whole. The $\sin(x)/x$ approximation meets the ITU-R BT.601-5 luminance filter response template for this design example.

Figure 5B:
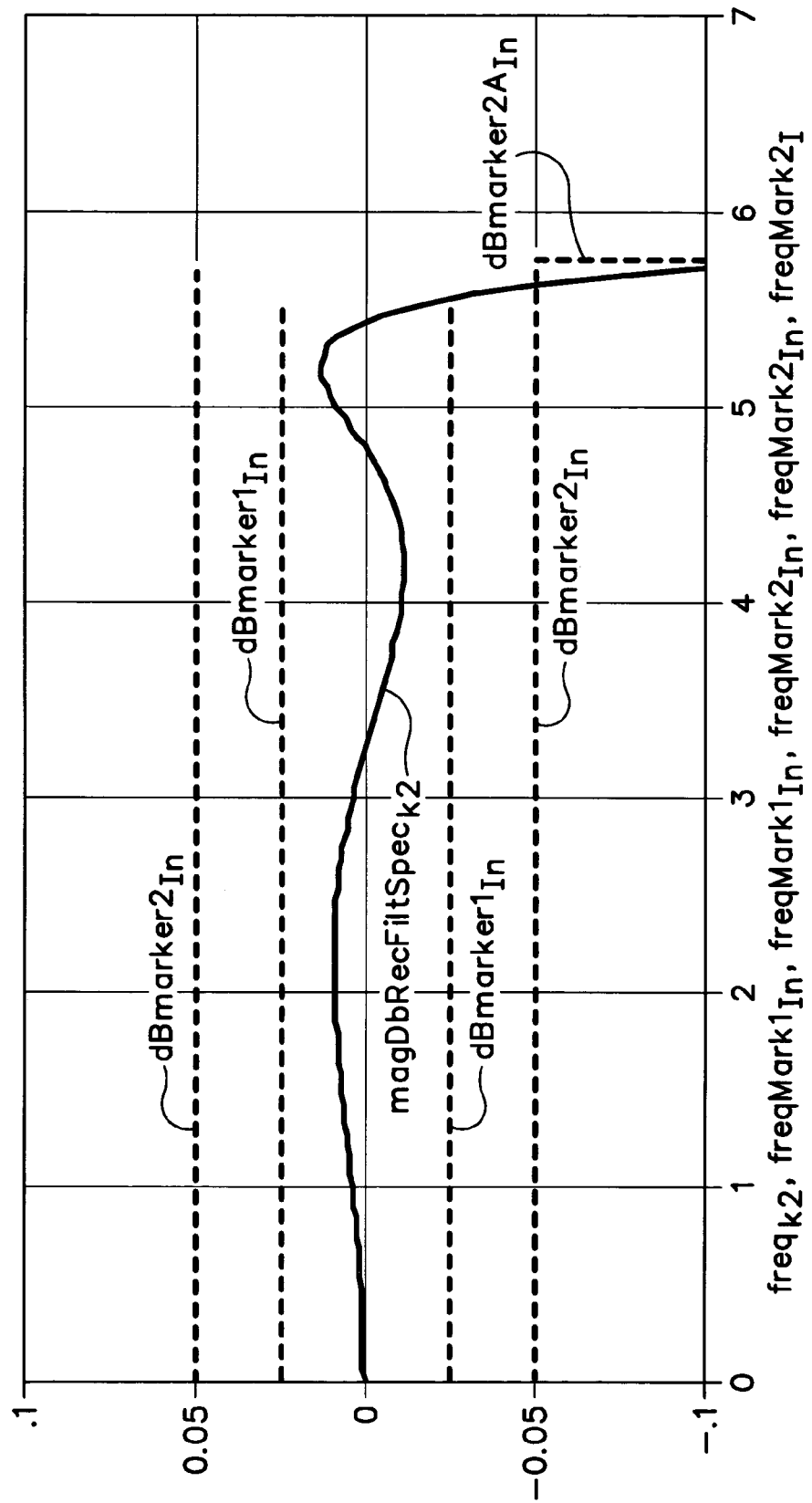

FIG. 5a is a plot of the frequency response of the reconstruction filter 10 with the ITU-R BR.601-5 luminance filter template shown. FIG. 5b is the same plot as in FIG. 5a zoomed in near zero dB. The coefficients used for this implementation were:

$$b_{0lo}=0.384525, a_{1lo}=-0.09765, b_{0hi}=0.253656, a_{1hi}=-0.6545$$

Since the IIR z-plane poles are at an angle of $\pi$ (Nyquist frequency), the sinusoidal response of the reconstruction filter 10 is created using one real pole instead of two complex poles required for every other possible sinusoidal frequency. Thus the number of filter poles is cut in half relative to the damped sinusoidal response at any other frequency. This results in a reduction from 16 to 8 multiplications and 32 to 8 additions so the design is faster and less expensive to implement.

Thus the present invention provides a reconstruction filter having a pair of IIR filters, one for the forward direction and the other for the reverse direction, the outputs of which are combined with an "all pass" filter to produce a desired filter $\sin(x)/x$ response.

What is claimed is:

1. A reconstruction filter having a seagull architecture comprising:
    a first infinite impulse response filter having as an input a signal delayed by one sample time and having as an output a first filter output;
    a second infinite impulse response filter having as an input a reverse version of the signal delayed by one sample time and having as an output a second filter output; and
    means for combining the first and second filter outputs and the signal to produce a reconstruction filter output.

2. The reconstruction filter as recited in claim 1 wherein each infinite impulse response filter comprises:
    a high frequency path coupled to the filter input to produce a high frequency filter output; and
    a low frequency path coupled to the filter input to produce a low frequency filter output, the low and high frequency filter outputs together forming the filter output for input to the combining means.

3. The reconstruction filter as recited in claim 2 wherein each frequency path comprises:
    a first multiplier having a first input coupled to the filter input and a second input coupled to receive a first filter coefficient, and having an output;
    a summer having a first input coupled to the output of the first multiplier and a second input, and having an output;
    a delay circuit having an input coupled to the output of the summer, and having a first output coupled to the combining means and a second output; and
    a second multiplier having a first input coupled to the second output of the delay circuit and a second input coupled to receive a second filter coefficient, and having an output coupled to the second input of the summer.

4. A method of reconstruction filtering an input signal comprising the steps of:
    infinite impulse response filtering the input signal delayed by one sample time to produce a first filter output;
    infinite impulse response filtering a reverse version of the input signal delayed by one sample time to produce a second filter output; and
    combining the first and second filter outputs and the input signal to produce a reconstruction filter output in response to the input signal.

* * * * *